United States Patent [19]
Hosoki et al.

[11] Patent Number: 5,585,722
[45] Date of Patent: Dec. 17, 1996

[54] APPARATUS FOR MEASURING PHYSICAL PROPERTIES OF MICRO AREA

[75] Inventors: Shigeyuki Hosoki, Hachiouji; Tsuyoshi Hasegawa, Suginami; Makiko Kohno, Kawasaki, all of Japan

[73] Assignee: Hitachi, Ltd., Tokyo, Japan

[21] Appl. No.: 317,737

[22] Filed: Oct. 4, 1994

[30] Foreign Application Priority Data

Oct. 4, 1993 [JP] Japan .................................. 5-248231

[51] Int. Cl.$^6$ ................................................. G01R 33/20
[52] U.S. Cl. ............................................ 324/318; 324/300
[58] Field of Search .................................. 324/307, 309, 324/300, 311, 312, 318, 322; 128/653.5

[56] References Cited

U.S. PATENT DOCUMENTS

| | | | |
|---|---|---|---|
| 4,733,182 | 3/1988 | Clarke et al. | 324/301 |
| 4,851,762 | 7/1989 | Kim et al. | 324/316 |
| 5,166,615 | 11/1992 | Sidles | 324/307 |
| 5,266,896 | 11/1993 | Rugar et al. | 324/307 |
| 5,298,863 | 3/1994 | Nowak | 324/318 |
| 5,319,977 | 6/1994 | Quate et al. | 73/606 |
| 5,410,910 | 5/1995 | Samlyo et al. | 73/105 |
| 5,412,322 | 5/1995 | Wollin | 324/318 |

FOREIGN PATENT DOCUMENTS

| | | |
|---|---|---|
| 0391040A2 | 10/1990 | European Pat. Off. . |
| 0551814A1 | 7/1993 | European Pat. Off. . |
| 040100 | 2/1993 | Japan . |

OTHER PUBLICATIONS

Manassen et al., "Electron Spin Resonance–Scanning Tunneling Microscopy Experiments on Thermally Oxidized Si(111)," Physical Review B, vol. 48, No. 7, Aug. 15, 1993, pp. 4887–4890.

Manassen et al., "Direct Observation of the Precession of Individual Paramagnetic Spins on Oxidized Silicon Surfaces," Physical Review Letters, vol. 62, No. 21, May 22, 1989, pp. 2531–2534.

Züger et al., "First Images from a Magnetic Resonance Force Microscope," Applied Physics Letters, 63 (18), Nov. 1, 1993, pp. 2496–2498.

Rugar et al., "Mechanical Detection of Magnetic Resonance," Letters to Nature, vol. 360, Dec. 10, 1992, pp. 563–566.

*Primary Examiner*—Michael Tokar
*Assistant Examiner*—Raymond Y. Mah
*Attorney, Agent, or Firm*—Antonelli, Terry, Stout & Kraus

[57] ABSTRACT

An apparatus for measuring physical properties of micro area which has an object to measure physical properties from a micro area on an atomic scale on the surface of a test sample such as electron spin, nuclear magnetic moment, and nuclear quadrupole moment in high sensitivity, allows the probe 2 of the atomic force microscope to approach the surface of the test sample 1, applies a magnetic field to the test sample 1 by the magnetic field generation coil 27 and the magnetic paths 22 to 26 and furthermore a high frequency electromagnetic field to the test sample 1 by the coils 16 and 17 respectively, and detects a signal from atoms existing on the surface of the test sample 1 which are resonant with the high frequency electromagnetic field by the probe 2.

8 Claims, 5 Drawing Sheets

APPARATUS FOR MEASURING PHYSICAL PROPERTIES OF MICRO AREA

BACKGROUND OF THE INVENTION

The present invention applies to a probe microscope such as a tunneling microscope or atomic force microscope for observing and measuring the shape of a micro area on a surface, local electronic state, or local nuclear state.

When physical property information such as electron spin, nuclear magnetic moment, and nuclear quadrupole moment is measured, it is very difficult conventionally to measure the two-dimensional or three-dimensional local distribution of, for example, impurities and defects in a semiconductor sample, even if the rate thereof in the whole is very low. The reason will be described hereunder. For example, in the case of electron spin resonance (ESR), the minimum number of spins $N_{min}$ which can be detected is expressed by the following equation.

$$N_{min}=(\kappa T/\mu^2)(\Delta H/H_o)(1/\pi^2 Q_o\eta\xi)(\kappa T_d\Delta f/2P_o)^{1/2}$$

where $P_o$ indicates the power of incident electromagnetic wave ($V_o^2/2R_o$), $T_d$ temperature of the detector, $\Delta f$ a band width of the detection apparatus which is about 1 Hz to 10 kHz, $Q_o$ a constant representing the sharpness of resonance of the cavity resonator which is up to about 5000 at no load, $\Delta H$ width of the adsorbed wave, $H_o$ intensity of the magnetic field, T power transmission factor from the oscillator to the cavity resonator, $\kappa$ a Boltzmann constant, $\mu$ magnetic moment of spin, $\eta$ a coefficient indicating the degree of effect of the magnetic behavior of the sample on the electromagnetic characteristics of the entire cavity resonator, and $\xi$ a coefficient derived from the cavity resonator which is between 1/3 and 1/8. When they are obtained by practical numerical values, the minimum number of spins which can be detected is at most 106 to 108 even in an ideal case. Therefore, it is quite difficult to analyze, for example, impurities and defects existing in a semiconductor sample or on the surface thereof on an atomic scale by this means.

Recently, on the other hand, a probe microscope using a micro probe as a detector such as a scanning tunneling microscope has be used widely as a means for structure observation and analysis of a sample surface on an atomic scale. Recently, a means for detecting the electron spin resonance phenomenon of a sample placed in a magnetic field by the micro probe of the aforementioned probe microscope has be proposed. This is indicated, for example, in Physical Review Letter, Vol. 62, No. 21, p. 2531 to 2534 and Japanese Patent Application Laid-Open No. 5-40100. The means detects ESR indirectly and has been proposed on the assumption that a tunneling current is changed at the same frequency by the magnetic moment which makes a precession motion at the Larmor frequency at the part of a sample where electron spin resonance occurs. It is indicated that the means separates and detects a tunneling current measured by the probe at each frequency by a filter.

According to the aforementioned prior art, the tunneling current which occurs in the gap between the sample in the electron spin resonance state and the tip of the micro probe contains the component which occurs on the basis of the sample surface shape and the high frequency component on the basis of the ESR. Namely, the tunneling current measured by the probe in this measurement contains different types of information such as the sample surface shape and electron spin resonance. Therefore, it is necessary to extract an ESR signal from the tunneling current and the ESR signal cannot be measured directly. As a result, to extract the ESR signal, it is necessary to repeat to scan the sample surface by the probe at each frequency of the electric field or magnetic field to be applied to the sample and to compare the frequency spectrum of the tunneling current which is obtained reproducibly at each frequency. Therefore, the extraction requires a lot of time and a complicated operation. In addition, the aforementioned measuring means can be applied only to a sample which generates a tunneling current, so that it is impossible to measure electron spin resonance of an insulating sample.

SUMMARY OF THE INVENTION

An object of the present invention is to eliminate the difficulties of the conventional measuring means mentioned above and to provide a method and apparatus for measuring physical property information of micro area which can directly measure a resonance signal of even such particles as absorbed molecules on a surface in high sensitivity on an atomic scale using a probe microscope so as to obtain physical property information such as electron spin, nuclear magnetic moment, and nuclear quadrupole moment.

Physical property information based on resonance such as electron spin, nuclear magnetic moment, and nuclear quadrupole moment from the atomic scale micro area of a test sample which is placed in a magnetic field and applied with a high frequency electromagnetic field is directly measured as a high frequency signal (resonance signal) by a metallic probe or a probe coated with metal of a probe microscope. When an STM is used as a probe microscope, since the probe has another function (measurement of the surface of a test sample, etc.), it is desirable to add a switch for changing the scanning state for allowing the probe to scan or the resonance signal detection state and to detect the resonance signal directly. Furthermore, to detect a resonance signal by executing probe scanning by a tunneling current in combination with the STM, the probe may have an electrode or an antenna structure that it is divided into at least two areas across an insulator and conductive members are installed in the areas and probe scanning by the tunneling current of the probe and resonance signal measurement may be executed at the same time.

Furthermore, a means for cooling the test sample may be installed and the measuring environment for the test sample may be in a vacuum atmosphere or in a liquid. In the case of measurement in a vacuum, it is desirable that the magnetic field applying means for applying a magnetic field to the test sample arranges the gap section for applying the magnetic field directly to the test sample in a vacuum and the coil section for generating a magnetic field outside the vacuum and the magnetic paths of the magnetic field applying means can be divided and separated mutually. The magnetic field applying means may be omitted depending on the type of physical property information measuring means (electron spin resonance (ESR), nuclear magnetic resonance (NMR), or nuclear quadrupole resonance (NQR)) and the measuring condition or an AC magnetic field applying means may be added.

According to the present invention, the probe functions as an antenna and detects physical property information of the test sample as a high frequency signal (electromagnetic wave). As a result, an atomic force microscope (AFM) or magnetic force microscope (MFM) can be used as a probe microscope and even if no tunneling current is generated between the probe and test sample surface such as a case that the test sample is an insulator, the physical property information of the test sample can be measured.

Among the aforementioned physical property information, for example, electron spin resonance (hereinafter abbreviated to ESR) indicates that when the test sample is placed in the magnetic field, the energy state which is a degenerated state is separated and generates a resonance phenomenon in the VHF band. This frequency is generally a high frequency of at least 100 MHz though it depends on the magnitude of magnetic field, so that it differs greatly from the conventional frequency band (DC, up to several kHz) in which a tunneling current is controlled. Therefore, unlike the aforementioned conventional method for detecting a tunneling current indirectly by a change in the current which appears in the tunneling current, the present invention seizes the target signal directly as a high frequency signal. According to the present invention, it is possible in principle to execute ESR signal measurement simultaneously with probe scanning. However, since the signal-to-noise ratio is reduced due to an increase in the stray capacity, probe scanning and ESR signal measurement are executed alternately. By doing this, the tunneling current control circuit controls probe scanning without being affected by a high frequency caused by the ESR and an ESR signal is detected in high sensitivity regardless of probe control. Almost the same may be said with nuclear magnetic resonance or nuclear quadrupole resonance though the frequency band is different.

Measurement by applying a magnetic field to a test sample in an ultra-high vacuum can be made without deteriorating vacuum pressure by realizing a constitution that the electromagnetic coil for generating a magnetic field is inserted in the flange for insulating the atmospheric pressure and vacuum section and placed outside the vacuum and only the magnetic path consisting of a magnetic substance and magnetic pole and piece are introduced into the vacuum.

According to the present invention, the information obtained from the probe of the probe microscope is the one from the micro area on an atomic scale. By doing this, therefore, the measuring apparatus of the present invention can obtain physical property information exactly in an atomic scale at a very high signal-to-noise ratio. Furthermore, according to the present invention, a liquid substance which is difficult to check under the atmospheric pressure or in an ultra-high vacuum or a test sample which is valid in measurement in a liquid such as a biological sample also can be measured (for example, the probe is inserted into a liquid for measurement).

As explained above, in the micro area physical property information measuring apparatus of the present invention, physical property information such as electron spin, nuclear magnetic moment, and nuclear quadrupole moment in a micro area of the surface of a test sample which cannot be measured conventionally can be measured directly in high sensitivity on an atomic scale without the intrinsic function of the scanning probe microscope being lost.

DESCRIPTION OF THE PREFERRED EMBODIMENTS

Figure 1:
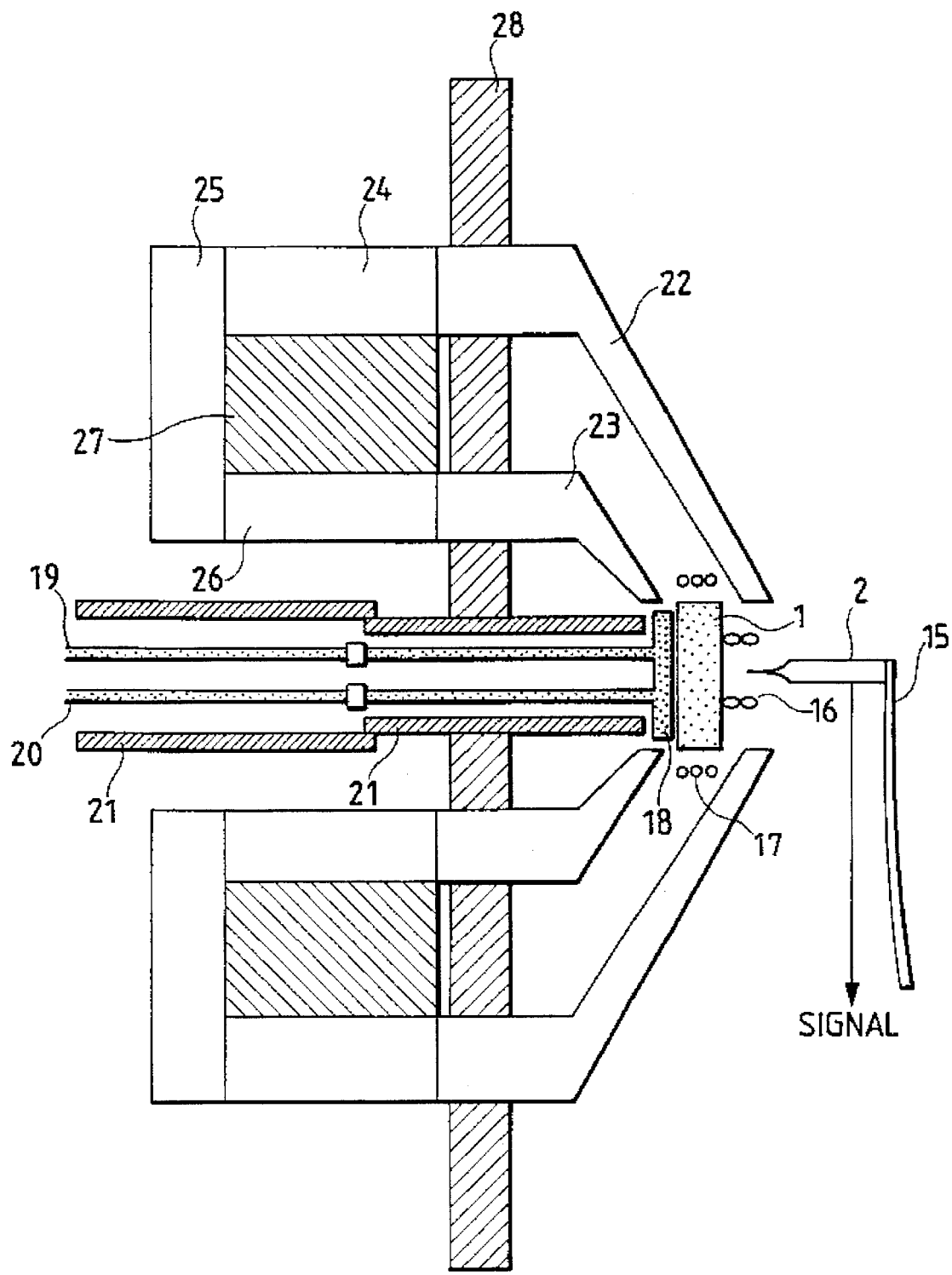
FIG. 1 is a block diagram of the apparatus of the first embodiment of the present invention.

The present invention will be explained more in detail hereunder with reference to the embodiments shown in the drawings. The same symbols shown in FIGS. 1 to 5 indicate the same or similar parts.

Embodiment 1

An embodiment of the present invention will be explained with reference to FIG. 1. An atomic force microscope (hereinafter abbreviated to AFM) is used as a probe microscope which directly detects a resonance signal. The atomic force microscope receives atomic force from a probe 2 attached to the tip of a cantilever 15, controls it, and measures the shape of the surface of a test sample 1 under normal AFM control. A probe 2 and a cantilever 15 of the AFM are structured so that a conductive member is attached to a part of the probe 2 and a signal is detected from it via a lead wire. On the other hand, the test sample 1 is placed in a magnetic field formed by a coil 27 for generating a magnetic field and magnetic paths 22 to 26 and applied with a high frequency electromagnetic field (a frequency which is lower than that of ESR by about 1~2 orders thereof, though it depends on the magnetic field intensity) which is given by a coil 16 or 17 or by both of them from a high frequency oscillator which is not shown in the drawing. If elements and defects which cause nuclear magnetic resonance (NMR) exist in the test sample 1 in this state, a resonance signal is observed from the probe 2 as an electromagnetic wave at a resonance frequency by coil 16 and 17 which apply the high frequency electric field. In this case, signals of adsorbed atoms on the surface of the test sample 1 are detected via the probe 2 in the same way as FIG. 2. In the measurement by the AFM as shown in this embodiment, no tunneling current is generated between the surface of the test sample 1 and the probe 2, so that the probe 2 can scan the surface of the test sample 1 and detect a high frequency signal (NMR signal) at the same time.

Embodiment 2

Figure 2:
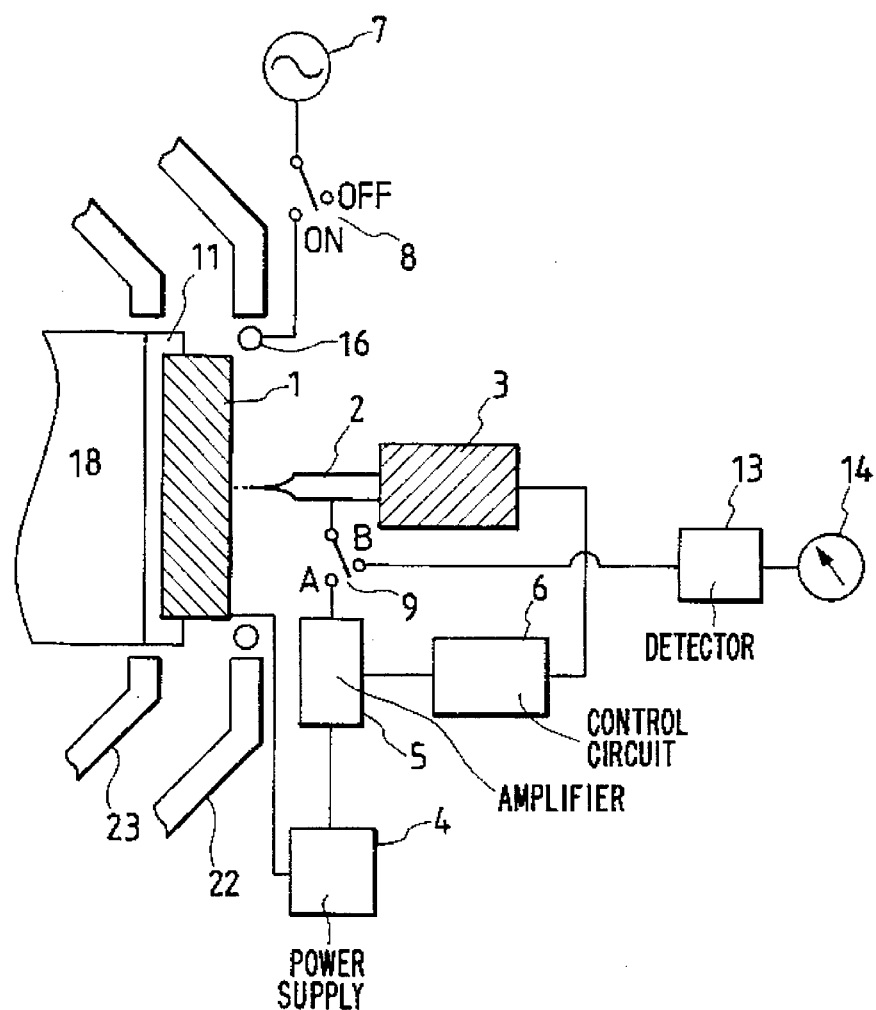
FIG. 2 is a schematic view of the second embodiment of the present invention.

In FIG. 2, the test sample 1 and the probe 2 keep the normal tunneling gap, and an amplifier 5 amplifies a tunneling current which flows by a bias voltage given by a power supply 4, and a control circuit 6 controls a piezoelectric element 3 so as to detect changes of increase and decrease in the current and to keep the current at a constant value. In this case, it is difficult for the control circuit 6 to respond at high speed because it controls a high voltage of at least 100 V, so that it controls response only up to several kHz. When a magnetic field is applied to the test sample 1 and an electromagnetic field is given to the coil 16 by a high frequency oscillator 7 and a change-over switch 8, a resonance signal on the basis of dangling bonds due to atoms and defects in the test sample 1 is detected by a detector 13 and a detection circuit 14.

Next, in the apparatus consisting of an STM, means for generating a static magnetic field (DC magnetic field), and means for applying a high frequency as mentioned above, direct measurement of a resonance signal will be described in detail. To bring the probe 2 close to the test sample 1, a signal from the high frequency oscillator 7 is cut off by the changeover switch 8, the contact of a change-over switch 9 is turned to the A side so as to drive the piezo-electric element 3, and probe scanning is started at the predetermined height. Since only a static magnetic field is applied to the test sample 1 in this state, the tunneling current will not be affected at all.

Next, measurement of a resonance signal (an NMR signal in this case) from the test sample 1 will be explained. To stop the probe scanning operation by the tunneling current of the probe 2, the contact of the change-over switch 9 is turned to the B side and to apply a high frequency signal to the test sample 1, the contact of the change-over switch 8 is turned to the ON side and high frequency power is applied to the test sample 1 from the coil 16. By doing this, an NMR signal is generated from an area of the test sample 1 where there are atoms of a specific element (for example, an impurity element). The electromagnetic wave of the NMR signal which is generated at the location on the surface of the test sample 1 which is opposite to the probe 2 is detected by the probe 2 which functions as an antenna.

Figure 3:
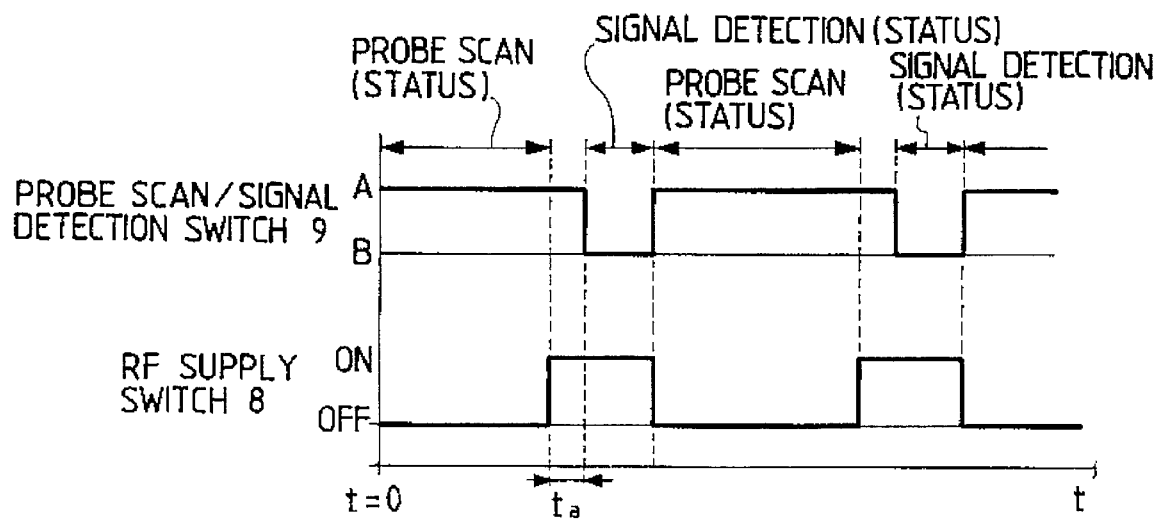
FIG. 3 is a time chart of the second embodiment of the present invention.

Since the probe 2 detects an NMR signal directly from each area on the surface of the test sample 1, it operates in the probe scan status and NMR signal detection status as shown in FIG. 3 (time chart). The probe 2 is also characterized in that it does not execute the scanning operation (automatic scanning of the probe on the basis of the tunneling current) when the high frequency signal is being applied to the test sample 1. Since the high frequency signal may not be stably supplied immediately even when the contact of the change-over switch 8 is turned ON, a symbol t shown in FIG. 3 indicates a slight time lag. If such a problem is not caused, t may be set to 0.

In the above, the NMR signal measurement was conducted by one probe. However, it is also possible to conduct the measurement employing a plurality of probes controlled by a plurality of servo circuit. In addition, if it is allowed to take somewhat more time, it is possible to employ a plurality of probes controlled by one servo circuit.

Embodiment 3

Figure 4:
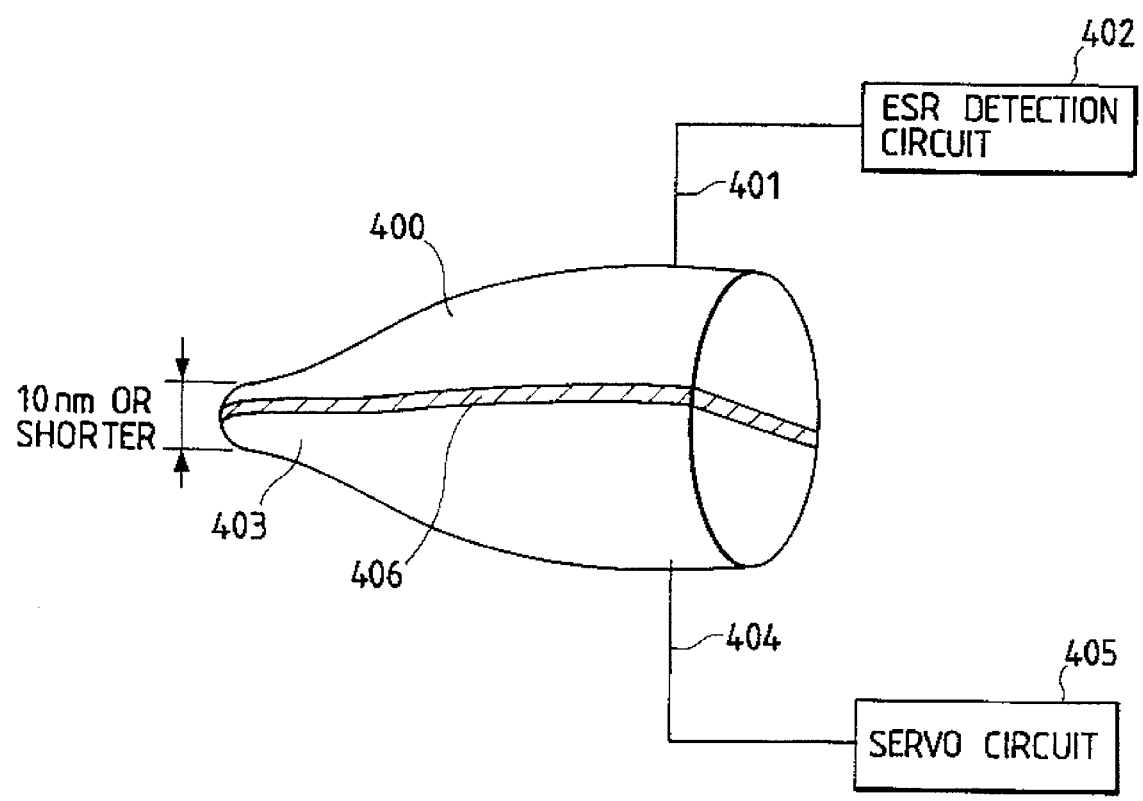
FIG. 4 is a detailed diagram of the probe tip of the third embodiment of the present invention.

An example where an ESR signal is directly observed simultaneously with probe scanning by using an STM will be explained hereunder. The conductive section is divided into two parts in the neighborhood of the tip of the probe 2 as shown in FIG. 4, and lead wires 401 and 404 are attached to the parts respectively. A signal from a conductive part 400 is supplied to an ESR detection circuit 402 for processing only ESR signals. A conductive part 403 detects a tunneling current from the lead wire 404 and supplies it to a servo circuit (probe scanning control) 405. By doing this, the probe 2 can control probe scanning automatically on the basis of the tunneling current by directly detecting an ESR signal. The conductive parts 400 and 403 are insulated by an insulating section 406. The conductive parts 400 and 403 may be formed on the surface of a needle-shaped member consisting of an insulating member or may be formed by laminating a conductive film and insulating film using a film forming method which can control on an atomic level and by forming the laminate in a needle shape. In this embodiment, the probe is insulated horizontally (in the axial direction). However, the probe may be separated vertically (perpendicular to the axis) so as to form the probe tip as a tunneling current detection section.

Embodiment 4

Figure 5:
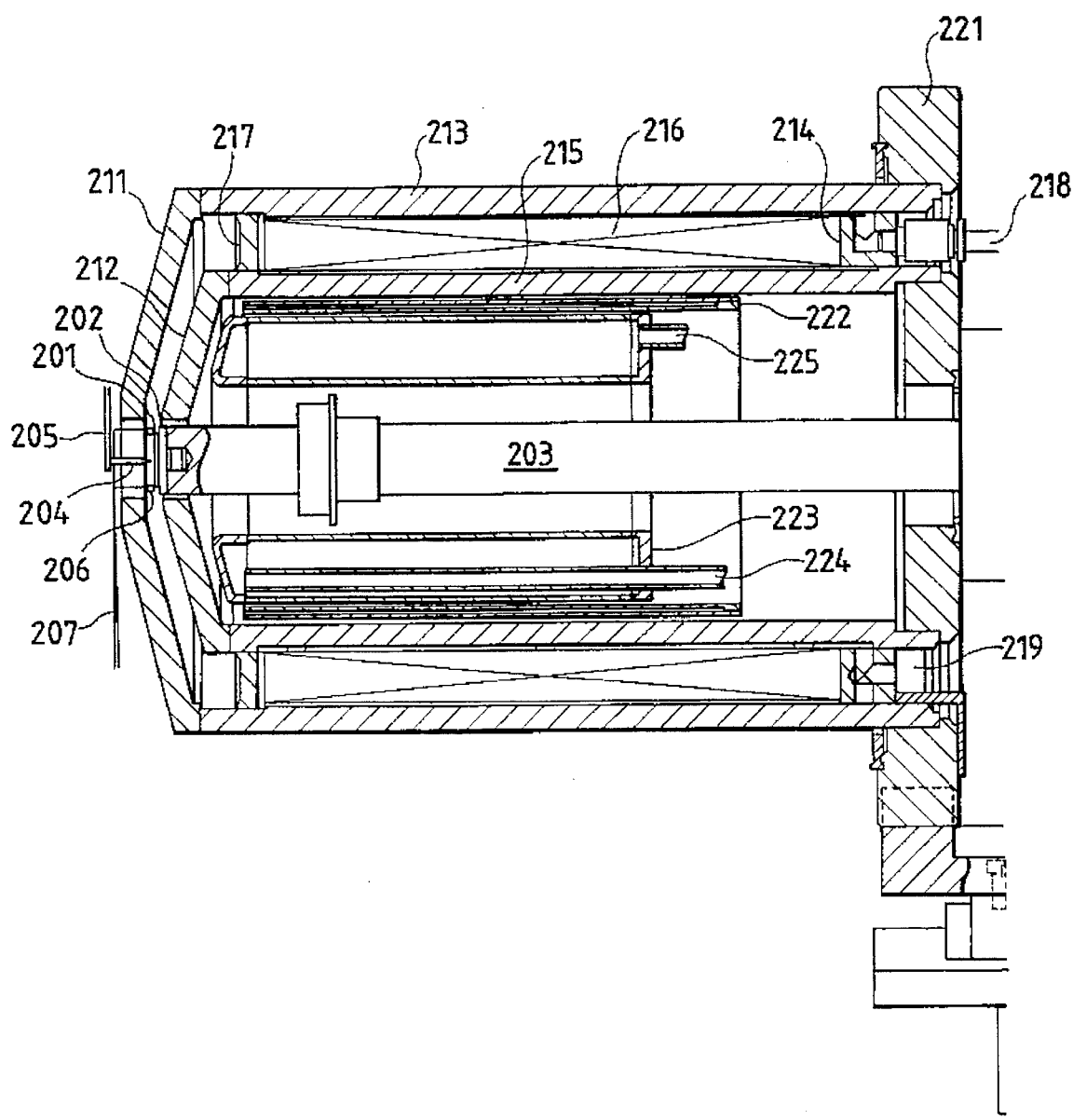
FIG. 5 is a block diagram of the apparatus of the fourth embodiment of the present invention.

Next, holding and cooling the test sample 1 will be explained in detail with reference to FIG. 5. In this embodiment, to measure NMR or NQR in an ultra-high vacuum, a flange 221 for insulating the atmospheric pressure side and vacuum side and magnetic paths 213 to 215 which are stored in the vacuum frame are connected and integrated in consideration of a structure for eliminating the effect of outgassing from a magnetic field generation section (a coil 216). The magnetic paths 213 to 215 are connected to conical magnetic paths 211 and 212 respectively at the ends thereof. The magnetic paths 213 and 215 are fixed on the same axis by a spacer 217 and the openings at the tops of the magnetic paths 211 and 212 connected to the above magnetic paths are placed on a concentric circle basis. Therefore, the magnetic field generated by the coil 216 passes through the gap between the magnetic paths 211 and 212 and forms a space with a high magnetic flux density between the two openings. A test sample 201 is fixed by a sample holder 202 installed at the end of a liquid helium cooling unit 203 in the space with a high magnetic flux density. A coil 206 for applying a high frequency electric field to the sample is installed in the space and high frequency power is supplied by a high frequency current transmission and detection wire 207. A probe 204 fixed to a cantilever 205 approaches the surface of the test sample 201 and detects an NMR or NQR signal from the test sample 201.

In this embodiment, by cooling the test sample 201 to the temperature of liquid helium, measurement with a very low noise can be executed. To increase the cooling efficiency for the test sample 201, the circumference of the liquid helium cooling unit 203 is thermally insulated by a vacuum, and liquid nitrogen is always supplied to a liquid nitrogen thermal shield 223 using an inlet tube 224 and an outlet tube 225 to lower the temperature of the circumference, and a thermal shield 222 consisting of a plurality of mirror-polished steel plates are arranged on the periphery of the liquid nitrogen thermal shield 223. To suppress the effect of heat release by the coil 216, cooling gas is supplied into the gaps between the coil 216 and the magnetic paths 213 to 215 and spacer 217 from an inlet 218 and ejected from an outlet 219 so as to cool the coil 216.

Embodiment 5

The basic constitution and operation principle of the apparatus for measuring physical property information of micro area of the present invention will be described using an embodiment for measuring electron spin resonance (ESR) using an atomic force microscope (AFM).

Figure 6:
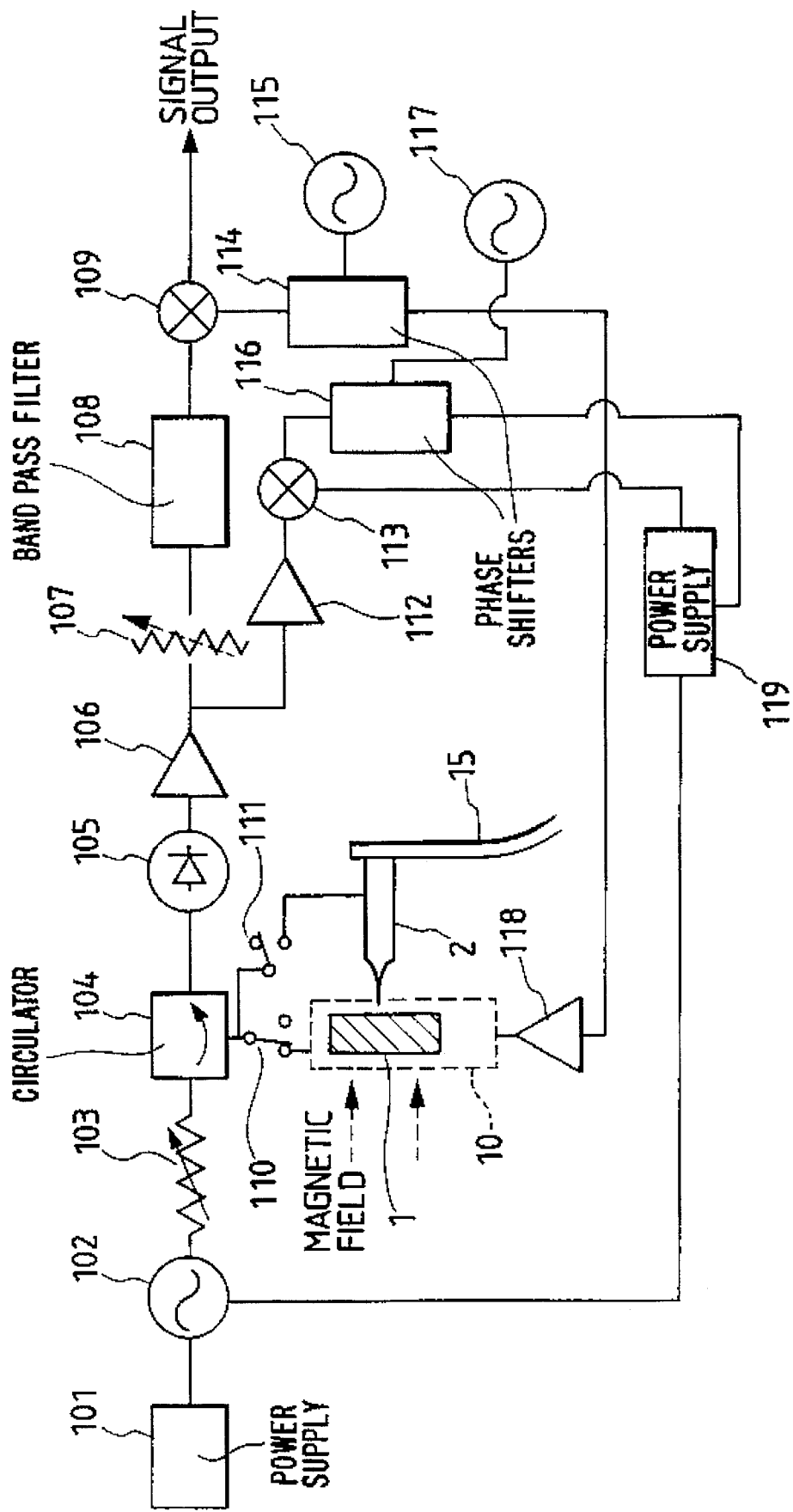
FIG. 6 is a schematic view of the fifth embodiment of the present invention.

FIG. 6 shows the basic constitution of the present invention together with a circuit for generating electron spin resonance by applying a high frequency electric field to a sample. The test sample 1 is installed in a cavity 10 in a state that the circumference thereof is enclosed by a magnetic field modulation coil. A microwave is supplied to the cavity 10 from a microwave oscillator 102 (driven by a gun oscillator power supply 101) via an attenuator 103 and a circulator 104. The electron spin resonance phenomenon of the test sample 1 which is generated by the microwave and magnetic field from the outside of the cavity 10 is detected by a crystal detector 105 as an absorbed signal of the microwave and sent to a signal phase detector 109 via a preamplifier 106, a signal gain adjuster 107, and a band pass filter 108. On the other hand, the magnetic field modulation coil (not shown in the drawing) installed in the cavity 10 forms a modulation magnetic field at a frequency of at least 30 kHz by an oscillator 115. The periodic wave generated by the oscillator 115 is supplied to the magnetic field modulation coil from a phase shifter 114 via a modulation amplifier 118 and also supplied to the signal phase detector 109. By doing this, the signal phase detector 109 converts the absorbed signal of the microwave by the electron spin resonance phenomenon to a periodic wave at the magnetic field modulation frequency and detects the differential shape of the signal by a low noise. The magnetic field modulation width can be set by the half-amplitude level of the absorption curve of the sample. To correct drift due to the temperature and others of the cavity 10 and the gun oscillator 101 and dislocation of the resonance point of the test sample 1 in the electron spin resonance state, the microwave oscillator 102 is also connected to an automatic frequency control circuit consisting of an amplifier 112, a phase detector 113, a phase shifter 116, an oscillator (a frequency of at least 3 kHz is generated) 117, and a varactor power supply 119.

The tip of the probe 2 fixed to the cantilever 15 via the opening (not shown in the drawing) of the cavity 10 approaches the surface of the test sample 1. The distance between the tip of the probe 2 and the surface of the test sample 1 is adjusted by an actuator (not shown in the drawing) installed to the cantilever 15 so that repulsive force or attractive force is generated in the interval by the atomic force (the distance is at most 1 nm). By doing this, the shape of the surface of the test sample 1 is measured as an operation of the cantilever 15 due to repulsive force or attractive force from atoms on the surface. When electron spin resonance is generated by the test sample 1, a resonance wave is generated between the occurrence section of the sample and the tip of the probe 2 close to the sample. In the normal ESR measurement, electron spin resonance of the entire sample is detected as a signal from the cavity 10 when a switch 110 is closed and a switch 111 is open, so that only average information of the entire test sample 1 is obtained. If the tip of the probe 2 is allowed to approach the electron spin resonance section of the test sample 1 in this state when the switch 111 is closed, a resonance wave generated between them can be detected by directly introducing it from the probe 2 into the crystal detector 105. By doing this, the part in a minute section of the test sample 1 in which electron spin resonance is generated can be measured locally, so that detailed information of atoms (for example, an impurity element) and defects (lattice defects) of the test sample 1 can be known. Furthermore, since a resonance wave which is generated between the surface of the test sample 1 and the tip of the probe 2 by electron spin resonance does not contain components other than ESR, it becomes unnecessary to separate the detected signal and the physical property information of the micro area of the test sample can obtained directly from this signal.

According to the present invention having the constitution shown in this embodiment, a resonance wave can be detected in an atomic scale area by the probe 2 regardless of $N_{min}$ which is defined in the aforementioned numerical formula. Therefore, for example, adsorbed atoms on the surface of the test sample 1 also can be measured in a very good state of signal-to-noise ratio. An ESR signal by the probe 2 may be obtained as a difference between a signal in the open state (detection only by the cavity) and a signal in the closed state (detection by the cavity and the probe 2) when the switch 111 is opened or closed when the switch 110 is closed or may be obtained as a resonance wave which is generated by closing the switch 110 and detected only by the probe 2 by closing the switch 111 simultaneously with opening the switch 110. There is a possibility that a resonance wave detected by the probe 2 contains information of not only the surface of the test sample 1 but also the probe 2 itself. However, by measuring the information of only the probe 2 beforehand, the two can be identified.

In each drawing mentioned above, a numeral 18 indicates a liquid helium cooling unit, 19 a liquid helium inlet tube, 20 a helium return tube, 21 a liquid nitrogen thermal shield, and 28 a flange.

What is claimed is:

1. An apparatus for measuring physical properties of a micro area of a sample, said apparatus comprising a probe, a servo circuit for flowing a tunneling current between said probe and the sample and controlling a location of the probe, means for applying a static magnetic field and high frequency electric field to the sample so as to generate a resonance signal, and selecting means for selecting alternately one of the tunneling current and resonance signal as a detection object in a gap between the sample and the probe.

2. An apparatus according to claim 1, wherein said selecting means are a first selecting arrangement installed as part of a probe circuit and a second selecting arrangement installed as part of a high frequency electric field supply circuit.

3. An apparatus according to claim 2, wherein said first selecting arrangement in said probe circuit and said second selecting arrangement in said high frequency electric field supply circuit operate in synchronization with each other.

4. An apparatus according to claim 1, wherein said apparatus has cooling means for cooling said sample.

5. An apparatus according to claim 1, wherein said sample is held in a vacuum and said physical properties are measured in a vacuum atmosphere.

6. An apparatus for measuring physical properties of micro area according to claim 1, wherein said test sample is held in a liquid and said physical property information is measured in a liquid.

7. An apparatus according to claim 5, wherein a magnetic pole section of said means for applying said static magnetic field to said sample is in said vacuum atmosphere and a coil section for generating said static magnetic field is outside said vacuum atmosphere.

8. An apparatus according to claim 7, wherein said magnetic pole section and said coil section can be divided or separated mutually.

\* \* \* \* \*